(12) United States Patent
Preyler et al.

(10) Patent No.: US 9,590,647 B2
(45) Date of Patent: Mar. 7, 2017

(54) NOISE-SHAPING CIRCUIT, DIGITAL-TO-TIME CONVERTER, ANALOG-TO-DIGITAL CONVERTER, DIGITAL-TO-ANALOG CONVERTER FREQUENCY SYNTHESIZER, TRANSMITTER, RECEIVER, TRANSCEIVER, METHOD FOR SHAPING NOISE IN AN INPUT SIGNAL

(71) Applicant: Intel IP Corporation, Santa Clara, CA (US)

(72) Inventors: Peter Preyler, Weyer (AT); Thomas Mayer, Linz (AT); Stefan Tertinek, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/856,854

(22) Filed: Sep. 17, 2015

(65) Prior Publication Data

US 2016/0182072 A1  Jun. 23, 2016

(30) Foreign Application Priority Data

Dec. 23, 2014  (DE) .................. 10 2014 119 480

(51) Int. Cl.
*H03B 21/00* (2006.01)
*H03L 7/20* (2006.01)
*H03M 3/00* (2006.01)

(52) U.S. Cl.
CPC ............... *H03L 7/20* (2013.01); *H03M 3/33* (2013.01); *H03M 3/436* (2013.01)

(58) Field of Classification Search
CPC .................................................. H03M 1/0626
See application file for complete search history.

(56) References Cited

U.S. PATENT DOCUMENTS

| 5,493,298 | A | 2/1996 | Bartz | |
|---|---|---|---|---|
| 5,774,842 | A * | 6/1998 | Nishio | ..................... H04N 5/21 348/E5.077 |
| 7,317,411 | B1 | 1/2008 | Nanda et al. | |
| 2004/0210611 | A1* | 10/2004 | Gradishar | ............... G06F 1/025 708/271 |
| 2005/0275577 | A1 | 12/2005 | Bjornsen | |

* cited by examiner

*Primary Examiner* — Daniel Puentes
(74) *Attorney, Agent, or Firm* — Eschweiler & Potashnik, LLC

(57) ABSTRACT

A noise shaping circuit according to an example includes a forward signal path configured to generate an output signal based on an input signal, a feedback signal path configured to feed back a feedback signal based on the output signal to the forward signal path, and a dither generator configured to generate a dither signal and to couple the dither signal into the forward signal path to modify the input signal and into the feedback signal path. Employing a noise shaping circuit according to an example may improve an overall noise performance.

18 Claims, 8 Drawing Sheets

NOISE-SHAPING CIRCUIT, DIGITAL-TO-TIME CONVERTER, ANALOG-TO-DIGITAL CONVERTER, DIGITAL-TO-ANALOG CONVERTER FREQUENCY SYNTHESIZER, TRANSMITTER, RECEIVER, TRANSCEIVER, METHOD FOR SHAPING NOISE IN AN INPUT SIGNAL

REFERENCE TO RELATED APPLICATION

This application claims priority to German Application number 10 2014 119 480.2 filed on Dec. 23, 2014, the contents of which are incorporated by reference in their entirety.

FIELD

The present disclosure relates to a noise-shaping circuit, a digital-to-time converter, an analog-to-digital converter, a digital-to-analog converter, a frequency synthesizer, a transmitter, a receiver, a transceiver, a method for shaping noise in an input signal and corresponding computer-related implementations.

BACKGROUND

In many applications, noise-shaping techniques are used to increase an apparent signal-to-noise ratio in a frequency range. Examples come from many fields of technology, for instance fields comprising digital or other quantized signal processing.

For instance, in many transmitter, receiver or transceiver applications, one or more local oscillator (LO) signals are used for up-mixing or down-mixing a signal to be transmitted or received, respectively. To reduce distortions more and more frequency synthesizers based on digital phase-locked loops (DPLLs) have become an important approach because they may allow a greater flexibility and an easier configurability for creating multiple local oscillator signals for multiple bands.

In this field, digital-to-time converters (DTCs) are becoming a more and more attractive approach for the generation of local oscillator signals in multi-standard radio-frequency (RF) transmitters, receivers or transceivers as they may benefit from the digital design flow including the possibility of RF synthesis. To name just one example, DTC-based transceiver architectures may be used in protocols, where carrier aggregation (CA) is used and where multiple local oscillator signals may have to be generated by a single radio frequency DPLL driving multiple DTCs. Such a DPLL- and/or DTC-based frequency synthesizer may allow a more robust operation with respect to distortions and a higher integration.

However, a DTC often quantizes with a finite number of levels, which may result in visible spurs in the spectrum. Moreover, in a digital DTC also the number of bits available may limit the spectral performance. To fulfill certain spectral requirements imposed, for instance, by the application, the protocol to be used or other implementation details, noise-shaping techniques may be used. However, conventional noise-shaping techniques may negatively influence the spectral response of such a system, for instance, at specific sensitive frequencies or frequency bands.

Therefore, a challenge exists to improve an overall noise performance of such a system.

However, not only in the field of transmitters, receivers or transceivers, similar challenges exist. They exist in many fields of signal processing, for instance, comprises digital audio processing, digital image processing, digital video processing, analog/digital conversion and similar technical applications and fields.

SUMMARY

Therefore, a demand exists to improve an overall noise performance of a system employing noise-shaping techniques is a demand widely met in many fields of technology.

This demand may be satisfied by a noise-shaping circuit, a digital-to-time converter, a frequency synthesizer, a transmitter, a receiver, a transceiver, a method for shaping noise in an input signal or corresponding software-related implementations according to any of the independent claims.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
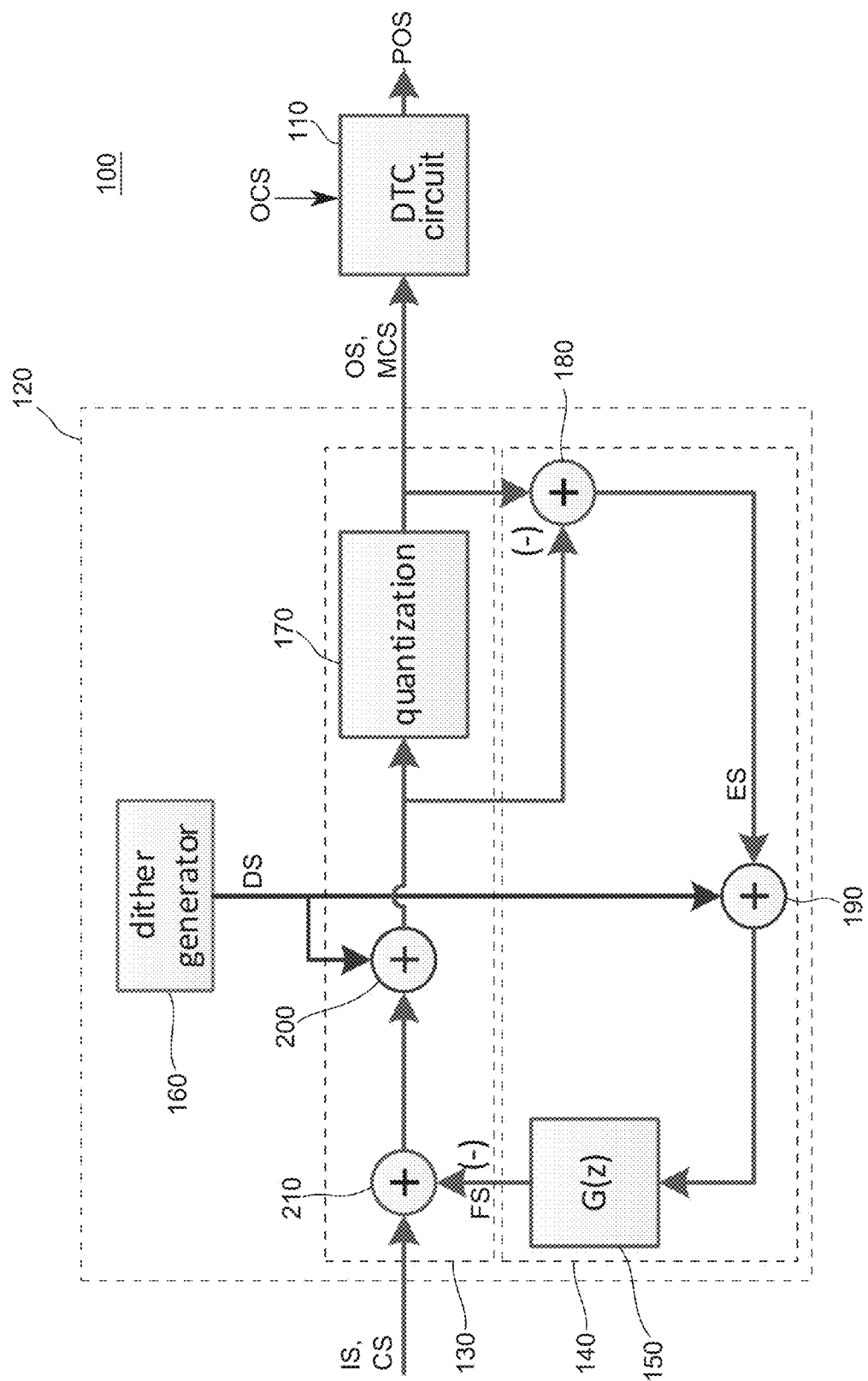
FIG. 1 shows a block diagram of a digital-to-time converter according to an example comprising a noise-shaping circuit according to an example.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

As briefly outlined before, in many fields of application noise-shaping techniques may be used to improve an apparent signal-to-noise ratio in some frequency bands. Examples come from many fields of technology, in which signals are to be processed. For instance, by using noise-shaping techniques it may be possible to influence the noise spectrum in such a way that a noise level in a more relevant frequency range may be reduced, while a noise level in a less important frequency range is increased. In some applications it may be possible to use filtering techniques to reduce the noise created in the less important frequency bands, when, for instance, the respective frequency band is sufficiently far away from the more relevant frequency band and it is not used application-wise, for instance, to transmit signals, to receive signals, to name just some examples.

However, in many fields of technology simply employing conventional noise-shaping techniques cannot be easily implemented since these noise-shaping techniques rely on dithering techniques which may introduce additional noise to the signal to be processed. As a consequence, the additional noise caused by the dithering may violate spectral requirements imposed by the application, a protocol or other implementation details.

Examples come essentially from all fields of technology, in which signals are to be processed and/or quantized. For instance digital audio processing, digital image processing and digital video processing are just some fields, in which noise-shaping techniques are employed. As will be laid out in more detail below, also in other fields of technology noise-shaping techniques can be employed.

Below, two examples will be shown in more detail, in which a noise-shaping circuit or corresponding noise-shaping techniques can be used. One example comes from the field of transmitters, receivers or transceivers comprising a frequency synthesizer employing one or more digital-to-time converters (DTCs). Another example comes from the field of analog-to-digital converters. However, a noise-shaping circuit according to an example as well as other examples including, for instance, a method for shaping noise in an input signal and corresponding software-related implementations described below can equally well be employed in other fields of technology. Hence, the examples outlined below simply represent some examples, in which the noise-shaping technique described below can be employed.

The first example comes from the field of transmitters, receivers and transceivers to transmit and/or receive signals, which may, for instance, comprise data. While a transmitter is designed to generate a signal and, optionally, to transmit the signal, a receiver is designed to receive appropriate signals. A transceiver is a circuit or device, which is capable of both transmitting and receiving signals. A transceiver may, for instance, comprise dedicated transmitter and receiver circuits, but may also comprise components or circuits which may be used for both, transmitting and receiving corresponding signals.

Although in the description below the signals will be mainly radio frequency signals transmitted, for instance, by radio, the transmitters, receivers and transceivers are by far not limited to employing radio-based transmission technology. For instance, also cable-bound transmissions as well as different frequencies above or below these frequencies may be used to transmit and/or to receive data. Moreover, instead of electric-based transmission schemes, which also include radio-based transmission schemes, also other transmission schemes may be used including, for instance, optical transmission schemes and magnetic transmission schemes to name just some examples.

Moreover, in the following mainly digital processing circuits will be described, in which a signal is sampled and quantized. In other words, in the following examples mainly digital signals will be described. However, it is by far not required to employ only digital signals, which are quantized in terms of the time (sampling) and in terms of the value they may acquire (quantization). In other examples, non-digital signals may be used in which at least one of time, the values or both are by far not required to be discrete. In the case of a signal having a continuous range or spectrum of values and being continuous in terms of time, such a signal is often referred to as an analog signal. In general, examples may also comprise corresponding analog or other non-digital implementations.

As briefly mentioned before, for transmitters, receivers and transceivers, digital-to-time converters (DTCs) may represent an attractive solution for the generation of one or more local oscillator (LO) signals in the multi-standard radio frequency (RF) transceiver environment. These systems may benefit from the digital design flow including the possibility of radio-frequency synthesis. DTCs may be particularly interesting in transmitters, receivers and transceivers supporting, for instance, downlink carrier aggregation (CA), in which multiple local oscillator signals are used to increase an overall transmission bandwidth. For instance, the multiple local oscillator signals may be generated by a single reference oscillator circuit comprising, for instance, a radio frequency digital phase-locked loop (RF DPLL), which drives multiple digital-to-time converters. Such a solution may save not only chip area, but may also avoid magnetic coupling issues, which may occur in from multi-DPLL solutions.

Generally speaking, a DTC delays an edge of an oscillating signal provided to an input of the DTC according to a control signal comprising a code word provided to a control input of the DTC. The desired local oscillator frequency can therefore be obtained by applying, for instance, a code ramp.

However, a DTC typically quantizes its delay of the oscillating signal provided at the input of the DTC according to a finite number of levels. This quantization may produce visible spurs in the spectrum of the DTC. Moreover, the number of bits of a digital DTC may also limit the spectral performance. Noise-shaping may be used to lower a quantization noise at specific frequencies in order to fulfill spectral requirements, for instance, at the so-called duplex distance. The duplex distance often refers to a frequency distance between frequencies used for uploading and downloading data. In other words, the duplex distance may refer to a frequency distance between receiving and transmitting signals. Depending on the standard and the technique involved, the duplex distance may be, for instance, in the range between 1 MHz and several 100 MHz.

As will be laid out in more detail below, examples employ additive dithering to remove, for instance, quantization spurs caused by the DTC. An example depicted in FIG. 2 and described below in more detail shows that it may be possible to use a noise shaping technology including dithering and still keep the spectral response introduced by the noise shaper circuit and still remove or at least dampen the quantization spurs. As a consequence, it may be possible to improve an overall noise performance of such a system.

Compared to a conventional approach, in an example of a noise-shaping circuit a dither signal is applied to both a forward signal path and a feedback signal path. Such a dither signal or dither sequence can therefore be used to smear quantization spurs. A straightforward addition will increase the power over all frequencies covering, for instance, the frequency-dependent behavior of the noise shaper. However, to keep the frequency-dependent behavior, the dithering signal is not only added to the forward signal path, but also the feedback loop or the feedback signal path of the noise shaper.

Dithering, without also adding the dither signal to the feedback signal path will very likely increase the spectral power independent of the frequency and might therefore lead to a violation of spectral requirements or error vector magnitude (EVM) targets laid out, for instance, by standards, application requirements or implementation details.

A noise-shaping circuit as well as a method for shaping noise in an input signal according to an example may be applied to many kinds of noise shaper for a systems based on quantizing and can also be used in combination with a non-linearity correction to name just a few examples.

FIG. 1 shows a block diagram of a digital-to-time converter 100 (DTC) comprising a digital-to-time converter circuit 110 (DTC circuit) as well as a noise-shaping circuit 120, which is also referred to as a noise shaper. The DTC circuit 110 is designed to generate a processed oscillating signal POS by delaying an oscillating signal OCS in response to a modified control signal MCS. The modified control signal indicates the amount of delay applied by the DTC circuit 110.

The modified control signal MCS is here an output signal OS of the noise-shaping circuit 120, the noise-shaping circuit 120 generates based on a control signal CS received as an input signal IS. The noise-shaping circuit 120 comprises a forward signal path 130 and a feedback signal path 140. The forward signal path 130 is configured to generate the output signal OS, which corresponds in the example depicted in FIG. 1 to the modified control signal MCS for the DTC circuit 110, based on the input signal IS, which corresponds to the control signal CS. The feedback signal path 140 is configured to feed back a feedback signal FS based on the output signal OS to the forward signal path 130.

To allow the feedback signal path 140 this, the feedback signal path 140 comprises a noise-shaping filter 150, which is referred to in FIG. 1 also by its filter function. The noise-shaping filter 150 generates during operation the feedback signal FS based on an error signal ES and provides the same to the forward signal path 130. The error signal ES indicates a difference of the output signal OS with respect to an intended value thereof. The intended value may be based on a value comprised in the input signal IS. The intended value may be modified, for instance, by the feedback signal FS and/or a dither signal DS.

The noise shaping filter 150 generating based on the error signal ES the feedback signal FS represents an example how the noise of the input signal IS may be shaped by providing the corresponding feedback signal FS back to the forward signal path 130. In principle, any suitable filter function G(z) may be used in the framework of the noise-shaping filter 150. For instance, both finite impulse response filters (FIR filters) and infinite impulse response filters (IIR filters) may be used. In its simplest form, the filter function G(z) may correspond to a simple delay by one clock cycle ($z^{-1}$). However, by appropriately implementing the noise-shaping filter 150 in principle any filter function may be implemented here.

The noise-shaping circuit 120 further comprises a dither generator 160 which is configured to generate the dither signal DS and to couple the dither signal into the forward signal path 130 to modify the input signal IS and into the feedback signal path 140.

The dither generator 150 may be specifically designed to generate, for instance, the dither signal DS comprising a white-noise spectral density. A white-noise spectral density is, under ideal circumstances, independent of the frequency or, in other words, constant as a function of the frequency f. However, the dither generator 160 may equally well be designed to generate the dither signal DS having a pink-noise spectral density, which is proportional to the inverse of the frequency f (proportional to $1/f = f^{-1}$) or—in more general terms—proportional to $f^{-\alpha}$, where $\alpha$ is a number larger than 0, but smaller than 2. Often, $\alpha$ is close to 1 so that the pink-noise spectral density is roughly proportional to the inverse of the frequency f.

The dither generator 160 may equally well be designed to generate a Brownian-noise spectral density, which is also referred to as a red-noise spectral density. The Brownian-noise spectral density corresponds to the noise produced by a Brownian motion and is approximately inversely proportional to the square of the frequency f (i.e. approximately proportional to $f^{-\alpha}$ with a value a being approximately equal to 2). However, the dither generator 160 may equally well be designed to produce the dither signal DS comprising a high-pass filtered white noise spectral density which may, for instance, be implemented by differentiating a signal having a white-noise spectral density. Naturally, the dither generator 160 may equally well be designed to produce, for instance, depending on a dither input signal any of the previously-mentioned spectral densities of the dither signal DS. In principle, the dither generator 160 may be designed to produce different spectral densities for different frequency bands or ranges, for instance, depending on the previously-mentioned dither input signal.

In the example depicted in FIG. 1, the forward signal path 130 of the noise-shaping circuit 120 comprises a signal processing circuit 170, which in turn is configured to generate the output signal OS based on the input signal IS modified by the dither signal DS. The signal processing circuit which is referred to in FIG. 1 as "quantization" may, for instance, comprise a quantization circuit configured to modify a value provided to the quantization circuit. For instance, the signal processing circuit 170 may be configured to re-quantize the signal provided to the signal processing circuit 170. The signal processing circuit may also be designed to reduce the number of different values the output signal OS can acquire with respect to the number of different values of the signal provided to the signal processing circuit 170. For instance, in the case of a digital implementation the signal processing circuit 170 may truncate values, for instance, transmitting only a specified number of most significant bits and truncating the corresponding number of least significant bits. However, the signal processing circuit 170 may also be designed to at least partially compensate a non-linearity of a component coupled to the noise-shaping circuit 120.

All these different examples may cause the output signal OS to deviate from an intended value. The intended value may correspond to a value of the input signal IS or a value changed, for instance, by the noise-shaping filter 150 and, hence, by the feedback signal FS and/or by the dither signal DS generated by the dither generator 160. As a consequence, a deviation or difference of the output signal from the value comprised in the signal provided to the signal processing circuit 170 occurs, which may then be provided to the noise-shaping filter 150 in the form of the error signal ES to perform the noise shaping. However, irrespective of the actual implementation of the signal processing circuit 170, the signal processing circuit 170 causes a deviation of the quantization of the output signal OS with respect to the signal provided through the signal processing circuit 170.

In the example depicted in FIG. 1, the signal processing circuit 170 may, for instance, be configured to at least one of reducing the number of different states of the output signal compared to the signal provided to the signal processing circuit 170 and compensating fully or at least partially a non-linearity of the DTC circuit 110.

The DTC 100 may be a fully digital DTC 100. As a consequence, also the noise-shaping circuit 120 may be a digital noise-shaping circuit 120 such that the forward signal path 130, the feedback signal path 140 and the dither generator 160 may also be configured to receive, process and provide signals comprising or indicating a sequence of digital values. In such an implementation, the signal processing circuit 170 may, for instance, comprise a look-up-table to at least partially counteract non-linearities of the DTC circuit 110. It may also truncate, for instance, a specified number of least significant bits depending on the capabilities of the DTC circuit 110 used.

To generate the error signal ES in the example depicted in FIG. 1, the feedback signal path 140 comprises a subtractor 180 which is coupled to an input of the signal processing circuit 170 and to an output of the forward signal path 130 to receive the output signal. The subtractor is further designed to generate the error signal ES based on a difference of the output signal and the signal provided to the signal processing circuit 170. In FIG. 1 this is indicated by the minus sign (−) which is used at an input of the subtractor 180 coupled to the input of the signal processing circuit 170. In other words, the signal provided to this inverting input of the subtractor 180 causes a sign change of 180° with respect to the signal provided to the signal processing circuit 170. In contrast, the output signal OS is provided to a non-inverting input of the subtractor 180 so that the output signal is not subjected to a sign change of a phase shift of 180°.

The error signal generated by the subtractor 180 by, for instance, subtracting the value of the output signal OS from the value of the signal provided to the signal processing circuit 170 is then provided to a dither signal combiner 190, to which also the dither generator 160 is coupled. As a consequence, the dither signal combiner 190 is designed to combine the error signal ES with a dither signal DS to provide the error signal ES in a dithered form, also referred to as dithered error signal, to the noise-shaping filter 150. Similarly, also the forward signal path 130 comprises a dither signal combiner 200 coupled between an input and the output of a forward signal path 130 to combine the dither signal DS with a signal provided to the dither signal combiner 200 of the forward signal path 130. In the implementation depicted in FIG. 1, the signal provided to the dither signal combiner 200 is the input signal modified by the feedback signal FS.

In the implementation depicted in FIG. 1, the dither signal combiner 190 and the feedback signal path 140 and the dither signal combiner 200 of the forward signal path 130 are designed and configured to combine the dither signal having the same phase relationship. In other words, both the dither signal combiner 190 and the dither signal combiner 200 use nominally the same phase shift to combine the dither signal DS with the error signal ES and the modified input signal IS. This may allow the cancellation or at least a reduction of the impact of the noise caused by the dither signal onto the spectral density of the output signal OS.

To modify the input signal IS, the forward signal path 130 comprises a feedback combiner 210, which is configured to modify the input signal IS by combining the input signal IS with a feedback signal FS. To be a little more precise, the feedback combiner 210 subtracts the feedback signal FS from the input signal IS as indicated by the minus sign (−) used at the input of the feedback combiner 210 to which feedback signal FS from the noise-shaping filter 150 is provided. Hence, the noise-shaping filter 150 is coupled to an inverting input of a feedback combiner 210, while the input signal is coupled to a non-inverting input of the feedback combiner 210. As described before, the inverting input of the feedback combiner 210 imposes an additional phase shift of 180° or an additional change of the sign compared to its non-inverting input.

The DTC 100 comprises, hence, a control system comprising a noise-shaping circuit 120 with a forward signal path 130 (forward part) and the feedback signal path 140 (feedback part). The quantization error caused by the signal processing circuit 170 is returned through the feedback signal path 140 of the noise-shaping circuit 120 and processed by the noise-shaping filter 150. As a consequence, the input data comprised in the input signal IS are provided by the feedback combiner 210 as forward path data to the dither signal combiner 200 to which the dither sequence of the dither signal DS is added. This signal is then provided to the signal processing circuit 170, which causes the control signal CS provided to the DTC 100 to be modified before it is provided to the DT circuit 110. Due to the influence of the quantization caused by the signal processing circuit 170, the modified control signal MCS is also referred to as quantized DTC input.

In this example, an additive dither is introduced before the quantization to smear quantization spurs. If the dither signal DS would only be added to the forward signal path 130 or the forward loop, it may be visible as an additive noise level in the resulting spectrum. For example, if the dither signal is independent of the frequency and comprises identically distributed random numbers, a flat noise level in the spectral output may eventually be observed.

However, by adding the dither signal DS also to the feedback signal path 140, the remaining error of the noise shaper input to the analog output may under ideal circumstances be restored. As a consequence, it may be possible to regain the original spectral response of the noise-shaping circuit 120. An example of the dithering method for a DTC-based receiver system is depicted in FIG. 2.

Figure 2:
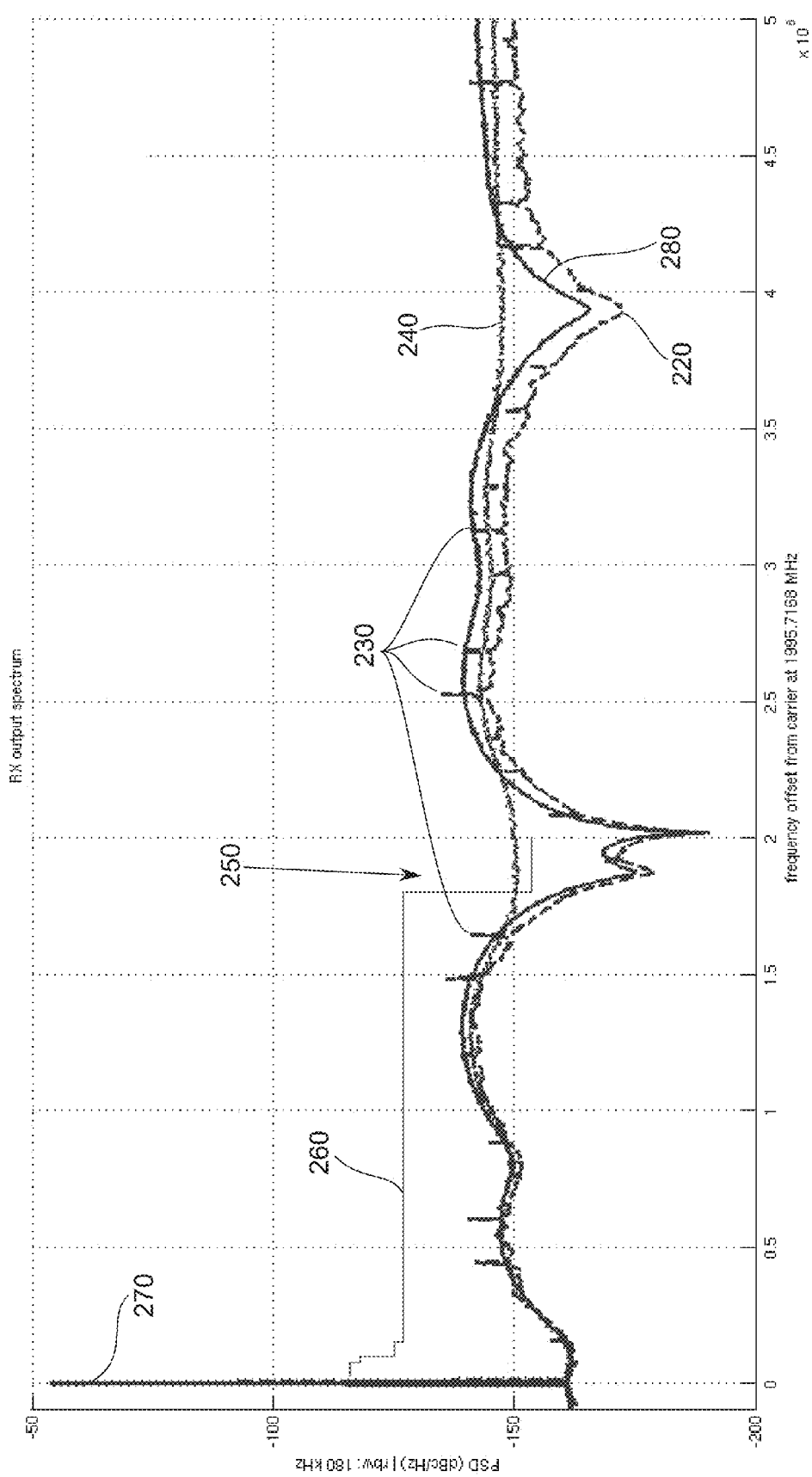
FIG. 2 shows a comparison of noise spectra using a noise-shaping circuit according to an example.

FIG. 2 shows three curves indicating a DTC-based receiver (RX) output spectrum. On the ordinate, the power of the spectral distribution (PSD) is shown in units of dBc/Hz, while the abscissa shows a frequency axis taking a frequency offset of a carrier at a frequency of 1995.7168 MHz into account. To be a little more specific, a first spectrum 220 illustrates the performance of a DTC 100 without the dither generator 160 generating a dither signal DS. In other words, the first spectrum 220 illustrates an output spectrum of a conventional DTC 100 which comprises a regular distribution of quantization spurs 230, some of which are marked with the reference sign 230. Depending on the implementation, these spurs, which may, for instance, be caused by the finite quantization of the DTC circuit 110, may negatively influence the performance of a system comprising the DTC 100. By adding a dither signal DS only to the forward signal path 130, the second spectrum 240 may result. Due to the additional dithering, the noise level is raised compared to the first spectrum 220, although the spurs 230 are no longer visible. However, in the frequency range 250, the second spectrum 240 exceeds a threshold or a receiver mask 260, which comprises in the frequency range 250 a steep edge. In the example depicted in FIG. 2, this edge in the frequency range 250 is caused by the duplex distance or, in other words, by the frequency used for the transmitter compared to the frequency of the carrier 270 used for receiving. In the example, the carrier 270 is located due to the compensation of the offset on the abscissa at a frequency of 0 MHz. The duplex distance in the example depicted is approximately 180 to 200 MHz. Hence, the additive dither provided only to the forward signal path 130 causes in this situation a raised level in the frequency range 250, which may be reduced or even regained due to applying the proposed method as indicated, for instance, in FIG. 1.

To illustrate this further, FIG. 2 furthermore shows a third spectrum 280, which approximately corresponds to the first spectrum 220 up to and including the frequency range 250. However, the third spectrum does not show the quantization spurs 230 of the first spectrum 220. Nevertheless, the noise level is slightly elevated in the frequency range up to and including the frequency range 250 compared to the first spectrum 220. However, in contrast to the second spectrum 240, the mask 260 is not exceeded even in the frequency range 250.

As a consequence, FIG. 2 illustrates that a noise-shaping circuit 120 implemented, for instance, in a DTC 100 may be capable of improving an overall noise performance of a system comprising such a DTC 100 according to an example, by, for instance, removing the quantization spurs 230 without causing the adverse effects in the frequency range 250 as indicated by the second spectrum 240. However, in other examples, different design goals and different effects may be observed, which may or may not improve the overall noise performance. In other words, FIG. 2 merely illustrates an example where a DTC 100 according to an example may be implemented.

Before further examples of systems comprising a noise-shaping circuit 120 according to an example will be presented, an example of a dither generator 160 will be described in more detail below. As outlined before, the dither generator 160 may be capable of generating the dither signal DS with different spectral densities. Depending on the different spectral densities to be used, using different implementations for the dither generator 160 may be interesting.

Figure 3:
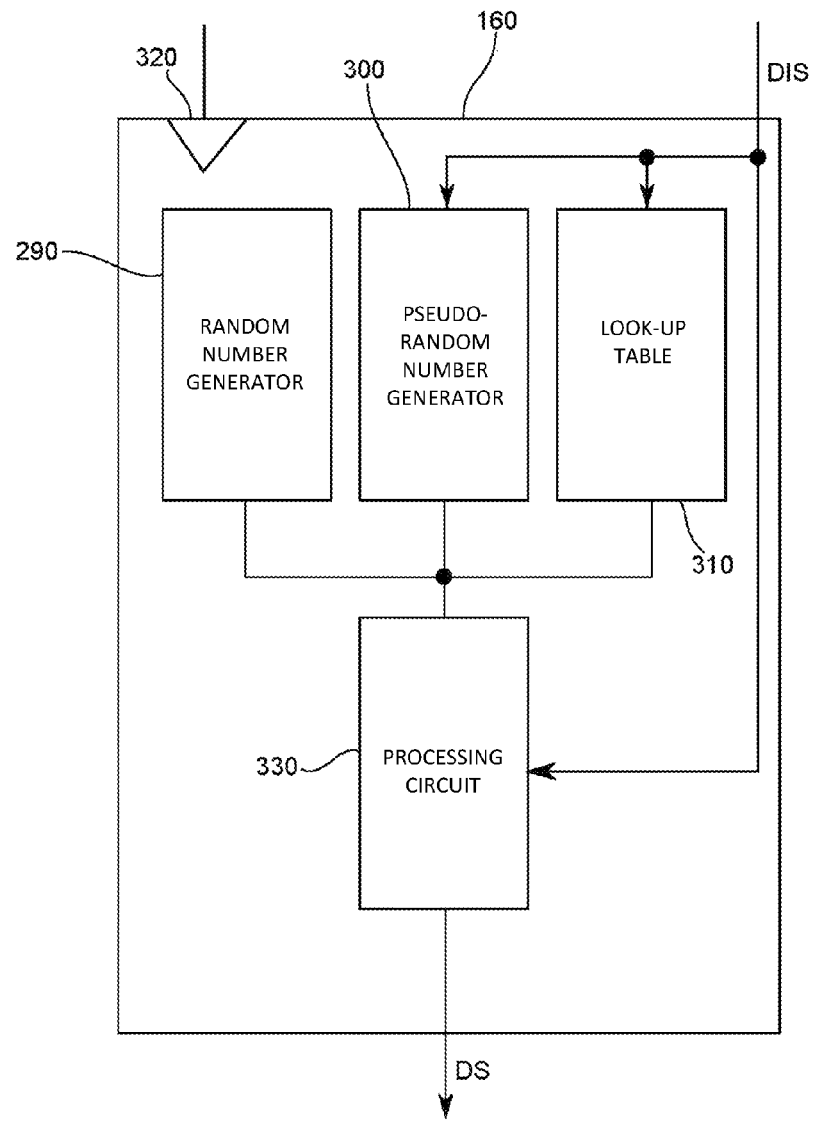
FIG. 3 shows a block diagram of a possible implementation of a dither generator used in a noise-shaping circuit according to an example.

FIG. 3 shows a block diagram of a dither generator 160. The dither generator 160 may, for instance, comprise a random number generator 290, which may produce true random numbers on the basis of which the dither signal DS may then be generated. A random number generator is specifically designed to generator true random numbers. It may, for instance, comprise a circuit element or the like, which is subjected to true random processes caused, for instance by physical or chemical processes. For instance, the circuit element may be based on variations of electronic devices such as thermal noise of a resistor, radioactive decaying processes or the like. As a consequence, a sequence of random numbers generated by the random number generator 290 is non-deterministic.

The dither generator 160 may additionally or alternatively comprise one or more sources of pseudo-random numbers, which are at least to some extent deterministically determined. For instance, the dither generator 160 may comprise a pseudo-random number generator 300, which may calculate, for instance, based on an dither input signal DIS a sequence of numbers, which resemble in terms of their statistical distribution at least to some extend random numbers. Nevertheless the pseudo-random numbers generated by the pseudo-random number generator 300 are deterministically determined and, hence, are not true random numbers. Pseudo-random numbers may, for instance, be calculated using recursive functions or the like. Often, pseudo-random number generators 300 require a seat value or another starting vector, which may be provided to the pseudo-random number generator 300 via the dither input signal DIS.

Depending on the implementation, a dither generator 160 may also comprise a look-up table 310, which may, for instance, comprise a sequence of pseudo-random numbers on the basis of which the dither signal DS may then be generated. Depending on the implementation, a starting index or starting value may be chosen, for instance, by providing the dither generator 160 with an appropriate value comprised in the dither input signal DIS to name just one example.

Irrespective of the question as to whether a true random number generator 290, a pseudo-random number generator 300 or a look-up table 310 is employed, all these components may generate random numbers or pseudo-random numbers. Based on the random numbers or pseudo-random numbers provided by these components, the dither generator 160 may optionally internally or as the dither signal DS generate a random signal or a pseudo-random signal, respectively. The random signal or a pseudo-random signal may then comprise one or more random numbers or pseudo-random numbers encoded in the respective signal. The random signal or pseudo-random signal may, for instance, be generated in response to a clock signal provided to an input 320. Hence, the dither generator 160 may be capable of generating the dither signal DS directly or indirectly based at least on one of a random signal, a pseudo-random signal and a dither input signal DIS.

Optionally, the dither generator 160 may comprise a processing circuit 330 to process the random signal or pseudo-random signal generated by the components 290, 300, 310 mentioned before. For instance, the processing circuit 330 may high-pass filter the respective signal and generate the dither signal DS as a high-pass filtered random or pseudo-random signal. For instance, such a high high-pass filtering may be implemented by differentiating the random signal or pseudo-random signal provided by the previously-mentioned components 290, 300, 310. However, the processing circuit 330 may also modify a distribution of the values provided by the previously-mentioned components, for instance, based on the dither input signal DIS. For instance, by redistributing the values in terms of their statistical probability or by re-quantizing the respective values or signals, it may be possible to adapt the dither generator 160 and, as a consequence, the statistical distribution of the dither signal DS to different modes of operation of the noise-shaping circuit 120.

This optional implementation along with the previously-mentioned optional implementations represent some examples of how the dither generator 160 may be capable of generating the dither signal DS comprising, for instance, a spectrum density depending on the dither input signal DIS.

It should be noted, however, that the question as to whether the dither generator 160 employs a random number generator 290, a pseudo-random number generator 300 or a look-up table 310 may be independent from the question of the spectral distribution of the values. In the case of a true random number generator 290, the underlying physical or chemical process may determine or at least influence the spectral distribution of the values. In the case of a pseudo-random number generator 300 and a look-up table 310, the system designers may influence the spectral distribution of the values and, hence, the spectral density of the resulting pseudo-random signals more freely.

Figure 4:
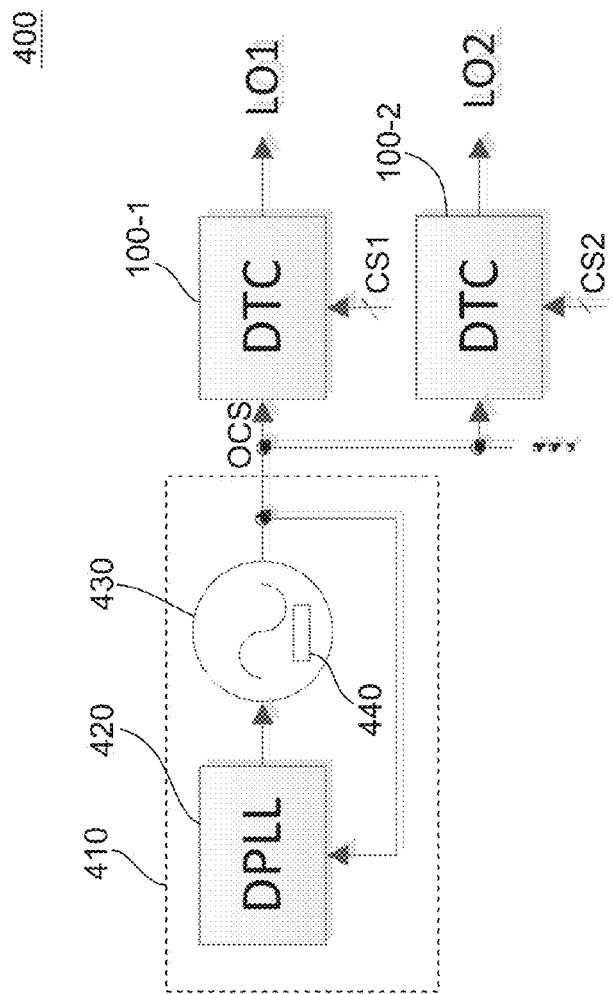
FIG. 4 shows a block diagram of a frequency synthesizer according to an example.

FIG. 4 shows a block diagram of an example of a frequency synthesizer 400 according to an example, which comprises a reference oscillator circuit 410 and at least one DTC 100 according to an example as described before. To be a little more specific, in the example depicted in FIG. 4, the frequency synthesizer 400 comprises a plurality of DTCs 100-1, 100-2, ..., according to an example. Each of the DTCs 100 is coupled to the reference oscillator circuit 410 to receive the same, common oscillating signal generated by the reference oscillator circuit 410. As described before, each of the DTCs 100 is designed to provide a local oscillator signal LO1, LO2, ..., in response to a control signal CS1, CS2, ..., respectively, based on the oscillating signal provided by the reference oscillator circuit 410. This may allow the generation of multiple local oscillator signals LO1, LO2, ..., based on a single reference oscillator circuit 410 to which all DTCs 100 are coupled.

For instance, the reference oscillator circuit 410 may comprise a phase-locked loop 420 (PLL) which may, for instance, be implemented as a digital PLL 420 (DPLL). The PLL 420 is coupled to a controllable oscillator 430 which generates at an output the oscillating signal for all of the DTCs 100. The output of the controllable oscillator 430 is fed back to the PLL 420, closing the phase-locked loop.

The controllable oscillator 430 may, for instance, comprise or be implemented as a voltage-controlled oscillator (VCO) and/or as a digitally controlled oscillator (DCO). As a consequence, the controllable oscillator 430 may comprise an inductance or another magnetically active component 440, which is indicated in FIG. 4 by a dotted rectangle.

By implementing a frequency synthesizer 400 comprising a plurality of DTCs 100 and only a single reference oscillator circuit 410 comprising an inductance or another magnetically active compound 440, it may not only be possible to save chip area in the case of an integrated circuit, it may also be possible to reduce or even prevent magnetic interactions between different reference oscillator circuits 410.

As a consequence, it may be possible to improve the performance of a frequency synthesizer 400, for instance, by providing more stable local oscillator signals LO1, LO2, .... The DTC-based local oscillator generation depicted in FIG. 4 may be employed, for instance, for carrier aggregation (CA).

A DTC-based architecture as shown in FIG. 4 may, hence, be used for local oscillator signal generation using a smaller area in the case of an implementation comprising an integrated circuit. Such an implementation may, for instance, comprise a substrate comprising the previously-mentioned circuits including, for instance, the reference frequency synthesizer 400, the DTC 100 or other components described above and below. By using a system based on an integrated circuit, it may be possible to use examples for instance, in high volume architectures such as computer system architectures in a wide sense, high volume interfaces employing corresponding devices and associated manufacturing processes including, for instance, thin film manufacturing processes and/or semiconductor manufacturing processes.

As the previous description has shown, using a noise-shaping circuit 120 according to an example may, for instance, allow smearing quantization spurs by dithering in a noise shaper for a DTC circuit 110. However, such a noise-shaper or noise-shaping circuit 120 based on dithering is by far not restricted to be applied to DTCs 100 or to the field of cellular transceivers, Wi-Fi implementations or the like. A noise-shaping circuit 120 may, for instance, be used along with a frequency-dependent dither level or spectral distribution to produce a distinct spectral response suitable for many applications. Dithering along with the described noise-shaping technique can in principle be used in all technical fields in which signals and data are processed. For instance, as will be shown in the next example, a noise-shaping circuit may be used in every quantized system. A local oscillator generation based on a DTC system may allow implementing an architecture, which can remove several PLLs 420 and/or one or more controllable oscillators 430 on a single chip or substrate.

Figure 5:
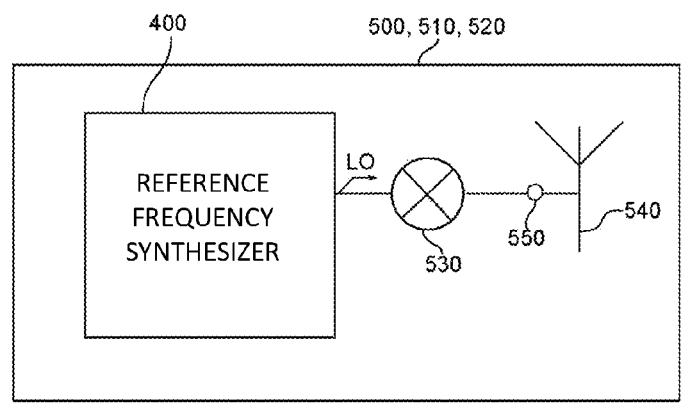
FIG. 5 shows a block diagram of a transmitter, a receiver or a transceiver according to an example.

Examples also comprise a transmitter 500, a receiver 510 or a transceiver 520 comprising a frequency synthesizer 400 as described before. A simplified block diagram of a transmitter 500, a receiver 510 or a transceiver 520 is depicted in FIG. 5. The transmitter 500, receiver 510 or transceiver 520 may further comprise one or more mixer circuits 530 to process the local oscillator signals LO provided by the frequency synthesizer 400. Depending on the number of local oscillator signals LO provided by the frequency synthesizer 400, the transmitter 500, the receiver 510 or the transceiver 520 may comprise a corresponding number of mixer circuits 530 to process the local oscillator signals LO independently of one another. The mixer circuits 530 may be coupled to the DTC 100 or the DTC circuits 110 to receive the process oscillating signals of the DTCs 100 or the DTC circuits 110 as respective local oscillator signals LO.

Depending on the implementation, the transmitter 500, the receiver 510 or the transceiver 520 may further comprise at least one of an antenna 540 or, for instance in the case of an implementation as an integrated circuit, a terminal 550 coupled to the mixer circuit 530 and configured to couple the antenna 540 to the mixer circuit 530. Depending on the implementation, for instance, on the number of mixer circuits 530 and the application, the transmitter 500, the receiver 510 or the transceiver 520 may comprise one or more antennas 540 and/or terminals 550 to allow antennas 540 to be coupled to the respective mixer circuits 530.

However, in case one terminal 550 or one antenna 540 is capable of transmitting or receiving signals corresponding to more than just one frequency of the local oscillator signals, the transmitter 500, the receiver 510 or the transceiver 520 may comprise one or more overlay circuits to allow the outputs of different mixer circuits 530 to be coupled to one terminal 550 or one antenna 540. For instance, to name just one example, all mixer circuits 530 may be coupled via a corresponding overlay circuit to a single terminal 550 or a single antenna 540.

Figure 6:
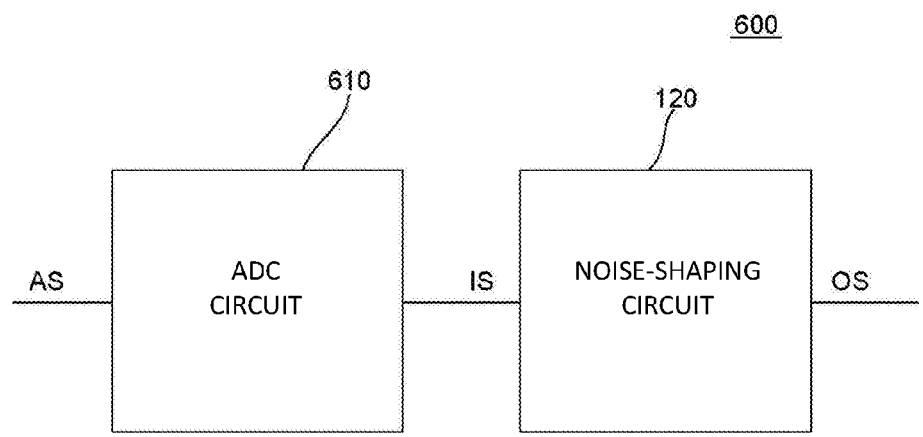
FIG. 6 shows a block diagram of an analog-to-digital converter according to an example.

However, as indicated before, examples are by far not limited to the generation of local oscillator signals or radio-based transmission technology. To illustrate briefly a further example, FIG. 6 shows a block diagram of an analog-to-digital converter 600 (ADC). The ADC 600 comprises an analog-to-digital converter circuit 610 (ADC circuit), which is configured to receive an analog signal AS and to generate a quantized and sampled signal. The ADC 600 further comprises a noise-shaping circuit 120 as described before which is coupled to the ADC circuit 610 to receive the quantized and sampled signal as the input signal IS. The noise-shaping circuit 120 may comprise, as previously described, a signal processing circuit 170 (not shown in FIG. 6) configured to at least one of re-quantizing the input signal IS, reducing the number of different values the output signal OS can acquire with respect to the number of different values of a signal provided to the signal processing circuit 170, reducing the number of different values the output signal OS can acquire with respect to the number of different values of the input signal IS provided to the noise-shaping circuit 120, and fully or at least partially compensating a non-linearity of the ADC circuit 610. As a consequence of all these operations the signal processing circuit 170 may perform, a change of the quantization of the input signal with respect to the output signal may occur. As a consequence, employing a noise-shaping circuit 120 according to an example may improve an overall noise performance of the ADC 600.

Figure 7:
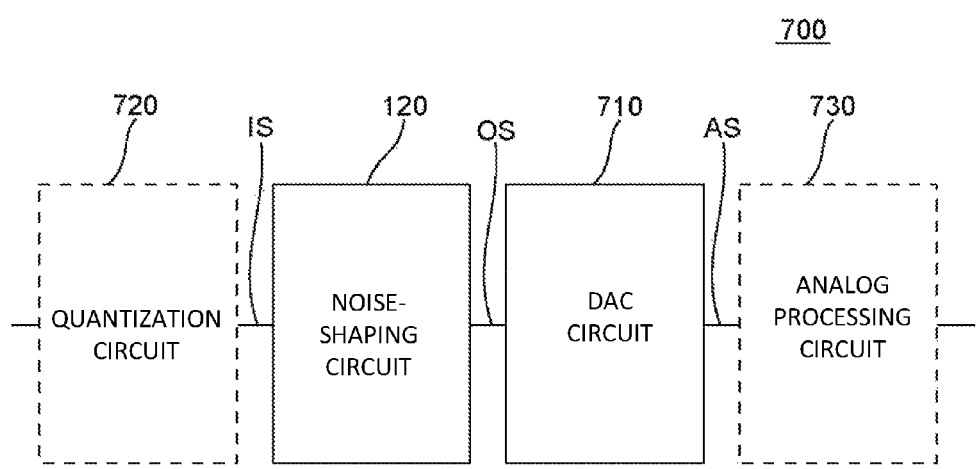
FIG. 7 shows a block diagram of a digital-to-analog converter according to an example.

FIG. 7 shows a block diagram of a digital-to-analog converter 700 (DAC). The DAC 700 comprises a digital-to-analog converter circuit 710 (DAC circuit), which is configured to receive a digital signal and to generate an analog signal based on the received digital signal. The DAC 700 further comprises a noise-shaping circuit 120 as described before, which is coupled to an input of the DAC circuit 710. For instance, the noise-shaping circuit 120 may provide the output signal OS to the input of the DAC circuit 710. As described before, the noise-shaping circuit 120 generates the output signal OS based on the input signal IS, which may be digital signal as described before.

The DAC circuit 710 may optionally comprise digital processing circuits like an interpolator and/or a sigma-delta modulator. Additionally or alternatively, the DAC 700 may further comprise a quantization circuit 720, which may be configured to requantize the digital signal. The DAC 700 may further comprise an optional active and/or passive analog processing circuit 730 such as filter circuits, amplifiers or the like.

Noise may arise from the optional digital processing circuits of the DAC circuit 710, the quantization circuit 720 and/or the generation of the analog signal AS by the DAC circuit 710. Noise may also arise from the optional analog processing circuit 730. The noise shaping circuit 120 may comprise a signal processing circuit 170 configured to at least one of re-quantizing the input signal IS, reducing the number of different values the output signal OS can acquire with respect to the number of different values of the signal provided to the signal processing circuit 170, reducing the number of different values the output signal OS can acquire with respect to the number of different values of the input signal IS provided to the noise shaping circuit 120, and at least partially compensating a non-linearity or a mismatch causing the noise of the digital-to-analog converter 700 and its components. As a consequence, an overall noise performance may be positively influenced by implementing the noise-shaping circuit 120 according to an example as outlined before.

Figure 8:
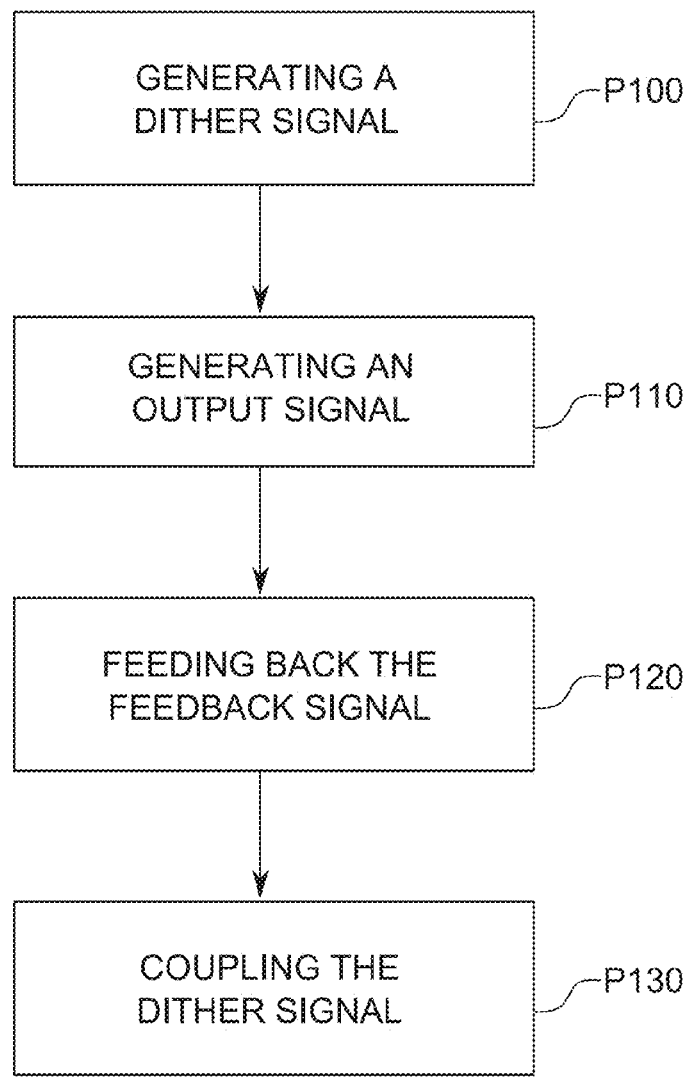
FIG. 8 shows a flowchart of a method for shaping noise in an input signal according to an example.

FIG. 8 shows a flowchart of a method for shaping noise in an input signal. In a process P100 using a dither generator 160, a dither signal DS is generated. In a process P110 an output signal OS based on the input signal IS is generated in a forward signal path 130. In a process P120 using a feedback signal path 140, a feedback signal FS is fed back based on the output signal OS to the forward signal path 130. Moreover, in a process P130, the dither signal DS is coupled into the forward signal path 130 to modify the input signal IS and into the feedback signal path 140.

Naturally, the processes are by far not required to be performed in the indicated order of FIG. 8. The processes may be performed in an arbitrary order, timely overlapping or even simultaneously. Naturally, the processes may also be performed several times or in a loop.

In the following examples pertain to further examples.

Example 1 is a noise shaping circuit comprising a forward signal path configured to generate an output signal based on an input signal, a feedback signal path configured to feed back a feedback signal based on the output signal to the forward signal path, and a dither generator configured to generate a dither signal and to couple the dither signal into the forward signal path to modify the input signal and into the feedback signal path.

In example 2, the subject matter of example 1 may optionally include the feedback signal path comprising a noise shaping filter configured to generate the feedback signal based on an error signal and to provide the feedback signal to the forward signal path, the error signal indicating a difference of the output signal with respect to an intended value.

In example 3, the subject matter of example 2 may optionally include the forward signal path further comprising a signal processing circuit configured to generate the output signal based on the input signal modified by the dither signal.

In example 4, the subject matter of example 3 may optionally include the feedback signal path comprising a subtractor coupled to an input of the signal processing circuit and an output of the forward signal path to receive the output signal and configured to generate the error signal based on a difference of the output signal and the signal provided to the signal processing circuit.

In example 5, the subject matter of any of the examples 3 or 4 may optionally include the signal processing circuit comprising a quantization circuit configured to modify a value of the signal provided to the quantization circuit.

In example 6, the subject matter of any of the examples 3 to 5 may optionally include the signal processing circuit being configured to at least one of re-quantizing the signal provided to the signal processing circuit, reducing the number of different values the output signal can acquire with respect to the number of different values of the signal provided to the signal processing circuit and at least partially compensating a non-linearity of a component coupled to the noise shaping circuit.

In example 7, the subject matter of any of the examples 2 to 6 may optionally include the feedback signal path comprising a dither signal combiner configured to combine the error signal with the dither signal to provide a dithered error signal to the noise shaping filter.

In example 8, the subject matter of example 7 may optionally include the forward signal path comprising a dither signal combiner coupled between an input and an output of the forward signal path to combine the dither signal with the signal provided to the dither signal combiner of the forward signal path.

In example 9, the subject matter of example 8 may optionally include the dither signal combiner of the feedback signal path and the dither signal combiner of the forward signal path being configured to combine the dither signal having the same phase relationship.

In example 10, the subject matter of any of the examples 1 to 9 may optionally include the noise shaping circuit being a digital noise shaping circuit, and wherein the forward signal path, the feedback signal path and the dither generator are configured to receive, process and provide signals comprising a sequence of digital values.

In example 11, the subject matter of any of the examples 1 to 10 may optionally include the forward signal path comprising a feedback combiner configured to modify the input signal by combing the input signal with the feedback signal.

In example 12, the subject matter of example 11 may optionally include the feedback combiner being configured to subtract the feedback signal from the input signal.

In example 13, the subject matter of any of the examples 1 to 12 may optionally include the dither generator being configured to generate the dither signal based at least on one of a random signal, a pseudo-random signal and a dither input signal.

In example 14, the subject matter of example 13 may optionally include the dither generator being configured to generate the dither signal comprising a spectral density depending on the dither input signal.

In example 15, the subject matter of any of the examples 1 to 14 may optionally include the dither generator being configured to generate the dither signal comprising at least one of a white noise spectral density, a pink-noise spectral density, a Brownian-noise spectral density and a high-pass filtered white-noise spectral density.

In example 16, the subject matter of any of the examples 1 to 15 may optionally include the dither generator comprising at least one of a random number generator, a pseudo-random number generator and a look-up-table to generate a random signal or a pseudo-random signal.

In example 17, the subject matter of example 16 may optionally include the dither generator further comprising a processing circuit configured to process the random signal or the pseudo-random signal.

In example 18, the subject matter of example 17 may optionally include the processing circuit of the dither generator being configured to at least one of high-pass filtering the random signal or the pseudo-random signal, differentiating the random signal or the pseudo-random signal and modifying a distribution of values of the random signal or the pseudo-random signal based on a dither input signal.

Example 19 is a digital-to-time converter comprising a noise shaping circuit according to any of the examples 1 to 18, wherein the noise shaping circuit is configured to receive a control signal as the input signal, and a digital-to-time converter circuit coupled to an output of the noise shaping circuit to receive the output signal from the noise shaping circuit as a modified control signal, wherein the digital-to-time converter circuit is configured to generate a processed oscillating signal by delaying a oscillating signal in response to the modified control signal.

In example 20, the subject matter of example 19 may optionally include the noise shaping circuit comprising a signal processing circuit configured to at least one of reducing a number of different states of the output signal compared to the signal provided to the signal processing circuit and compensating a non-linearity of the digital-to-time converter circuit fully or at least partially.

In example 21, the subject matter of any of the examples 19 or 20 may optionally include the digital-to-time converter being a digital digital-to-time converter.

Example 22 is an analog-to-digital converter comprising an analog-to-digital converter circuit configured to receive an analog signal and to generate a quantized and sampled signal, and a noise shaping circuit according to any of the examples 1 to 18 coupled to the analog-to-digital converter circuit to receive the quantized and sampled signal as the input signal.

In example 23, the subject matter of example 22 may optionally include the noise shaping circuit comprising a signal processing circuit configured to at least one of re-quantizing the input signal, reducing the number of different values the output signal can acquire with respect to the number of different values of the signal provided to the signal processing circuit, reducing the number of different values the output signal can acquire with respect to the number of different values of the input signal provided to the noise shaping circuit, and at least partially compensating a non-linearity of the analog-to-digital converter circuit.

Example 24 is a frequency synthesizer comprising a reference oscillator circuit, and a digital-to-time converter according to any of the examples 19 to 21, wherein the reference oscillator circuit is coupled to the digital-to-time converter circuit and configured to provide the oscillating signal to the digital-to-time converter, wherein the digital-to-time converter circuit is configured to provide the processed oscillating signal as a local oscillator signal.

In example 25, the subject matter of example 24 may optionally include a plurality of digital-to-time converters according to any of the examples 19 to 21, wherein each of the digital-to-time converter circuits is coupled to the reference oscillator circuit to receive the oscillating signal generated by the reference oscillator circuit.

In example 26, the subject matter of example 25 may optionally include the local oscillator circuit comprising a single reference oscillator circuit, which is coupled to all digital-to-time converter circuits of the plurality of digital-to-time converters to provide the digital-to-time converter circuits with the same oscillating signal.

In example 27, the subject matter of any of the examples 24 to 26 may optionally include the reference oscillator circuit comprising an inductance or another magnetically active component.

Example 28 is a transmitter, a receiver or a transceiver comprising a frequency synthesizer according to any of the examples 24 to 27.

In example 29, the subject matter of example 28 may optionally include a mixer circuit coupled to the digital-to-time converter to receive the processed oscillating signal of the digital-to-time converter as the local oscillator signal.

In example 30, the subject matter of example 29 may optionally include at least one of an antenna coupled to the mixer circuit and a terminal coupled to the mixer circuit and configured to couple an antenna to the mixer circuit.

Example 31 is a digital-to-analog converter comprising a digital-to analog converter circuit configured to receive a digital signal and to generate an analog signal, and a noise shaping circuit according to any of the examples 1 to 18 coupled to the digital-to-analog converter circuit to receive an input signal and to generate the output signal as the digital signal for the digital-to analog converter circuit.

In example 32, the subject matter of example 31 may optionally include the noise shaping circuit comprising a signal processing circuit configured to at least one of re-quantizing the input signal, reducing the number of different values the output signal can acquire with respect to the number of different values of the signal provided to the signal processing circuit, reducing the number of different values the output signal can acquire with respect to the number of different values of the input signal provided to the noise shaping circuit, at least partially compensating a non-linearity of the digital-to-analog converter and at least partially compensating a mismatch of the digital-to-analog converter.

Example 33 is a method for shaping noise in an input signal, the method comprising generating, using a dither generator, a dither signal, generating an output signal based on the input signal in a forward signal path, feeding back, using a feedback signal path, a feedback signal based on the output signal to the forward signal path and coupling the dither signal into the forward signal path to modify the input signal and into the feedback signal path.

In example 34, the subject matter of example 33 may optionally include feeding back the feedback signal comprising generating the feedback signal based on an error signal and providing the feedback signal to the forward signal path by a noise shaping filter, wherein the error signal is indicating a difference of the output signal with respect to an intended value.

In example 35, the subject matter of example 34 may optionally include generating the output signal comprising generating the output signal by signal processing based on the input signal modified by the dither signal.

In example 36, the subject matter of example 35 may optionally include feeding back the feedback signal comprising subtracting a signal prior to signal processing and the output signal of the forward signal path and generating the error signal based on a difference of the output signal and the signal prior to signal processing.

In example 37, the subject matter of any of the examples 35 or 36 may optionally include the signal processing comprising modifying a value of the signal prior to modifying.

In example 38, the subject matter of any of the examples 35 to 37 may optionally include the signal processing comprising at least one of re-quantizing the signal to be processed, reducing the number of different values the output signal can acquire with respect to the number of different values of the signal prior to signal processing and at least partially compensating a non-linearity of a component.

In example 39, the subject matter of any of the examples 34 to 38 may optionally include coupling the dither signal into the feedback signal path comprising combining the error signal with the dither signal to provide a dithered error signal and providing the dithered error signal to the noise shaping filter.

In example 40, the subject matter of example 39 may optionally include coupling the dither signal into the forward signal path and into the feedback signal path comprising combining the dither signal having the same phase relationship.

In example 41, the subject matter of any of the examples 33 to 40 may optionally include the method being digitally performed, and wherein the signals comprise a sequence of digital values.

In example 42, the subject matter of any of the examples 31 to 41 may optionally include feeding back the feedback signal comprising modifying the input signal by combing the input signal with the feedback signal.

In example 43, the subject matter of example 42 may optionally include combining the input signal with the feedback signal comprising subtracting the feedback signal from the input signal to modify the input signal.

In example 44, the subject matter of any of the examples 33 to 43 may optionally include generating the dither signal comprising generating the dither signal based at least on one of a random signal, a pseudo-random signal and a dither input signal.

In example 45, the subject matter of example 44 may optionally include generating the dither signal comprising generating the dither signal comprising a spectral density depending on the dither input signal.

In example 46, the subject matter of any of the examples 33 to 45 may optionally include generating the dither signal comprising generating the dither signal comprising a white noise spectral density, a pink-noise spectral density, a Brownian noise shape or a high-pass filtered white noise spectral density.

Example 47 is a machine readable storage medium including program code, when executed, to cause a machine to perform the method of any one of examples 33 to 46.

Example 48 is a machine readable storage including machine readable instructions, when executed, to implement a method or realize an apparatus as described in any pending example.

Example 49 is a computer program having a program code for performing any of the methods of examples 33 to 46, when the computer program is executed on a computer or processor.

Example 50 is a means for shaping the noise in an input signal, the means comprising a means for generating a dither signal, a means for generating an output signal based on the input signal in a forward signal path, a means for feeding back, using a feedback signal path, a feedback signal based on the output signal to the forward signal path, and a means for coupling the dither signal into the forward signal path to modify the input signal and into the feedback signal path.

Employing a noise shaping circuit according to an example may improve an overall noise performance.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A noise shaping circuit comprising:
   a forward signal path configured to generate an output signal based on an input signal;
   a feedback signal path configured to feed back a feedback signal based on the output signal to the forward signal path; and
   a dither generator configured to generate a dither signal and to couple the dither signal into the forward signal path to modify the input signal and into the feedback signal path,
   wherein the feedback signal path comprises a noise shaping filter configured to generate the feedback signal based on an error signal and to provide the feedback signal to the forward signal path, the error signal indicating a difference of the output signal with respect to an intended value, and
   wherein the feedback signal path comprises a dither signal combiner configured to combine the error signal with the dither signal to provide a dithered error signal to the noise shaping filter.

2. The noise shaping circuit according to claim 1, wherein the forward signal path further comprises a signal processing circuit configured to generate the output signal based on the input signal modified by the dither signal.

3. The noise shaping circuit according to claim 2, wherein the feedback signal path comprises a subtractor coupled to an input of the signal processing circuit and an output of the forward signal path to receive the output signal and configured to generate the error signal based on a difference of the output signal and the signal provided to the signal processing circuit.

4. The noise shaping circuit according to claim 2, wherein the signal processing circuit comprises a quantization circuit configured to modify a value of the signal provided to the quantization circuit.

5. The noise shaping circuit according to claim 2, wherein the signal processing circuit is configured to at least one of re-quantizing the signal provided to the signal processing circuit, reducing the number of different values the output signal can acquire with respect to the number of different values of the signal provided to the signal processing circuit and at least partially compensating a non-linearity of a component coupled to the noise shaping circuit.

6. The noise shaping circuit according to claim 1, wherein the forward signal path comprises a dither signal combiner coupled between an input and an output of the forward signal path to combine the dither signal with the signal provided to the dither signal combiner of the forward signal path.

7. The noise shaping circuit according to claim 6, wherein the dither signal combiner of the feedback signal path and the dither signal combiner of the forward signal path are configured to combine the dither signal having the same phase relationship.

8. The noise shaping circuit according to claim 1, wherein the noise shaping circuit is a digital noise shaping circuit, and wherein the forward signal path, the feedback signal path and the dither generator are configured to receive, process and provide signals comprising a sequence of digital values.

9. The noise shaping circuit according to claim 1, wherein the dither generator is configured to generate the dither signal based at least on one of a random signal, a pseudo-random signal and a dither input signal.

10. The noise shaping circuit according claim 9, wherein the dither generator is configured to generate the dither signal comprising a spectral density depending on the dither input signal.

11. The noise shaping circuit according claim 1, wherein the dither generator is configured to generate the dither signal comprising at least one of a white noise spectral density, a pink-noise spectral density, a Brownian-noise spectral density and a high-pass filtered white-noise spectral density.

12. The noise shaping circuit according to claim 1, wherein the dither generator comprises at least one of a random number generator, a pseudo-random number generator and a look-up-table to generate a random signal or a pseudo-random signal.

13. The noise shaping circuit according to claim 12, wherein the dither generator further comprises a processing circuit configured to process the random signal or the pseudo-random signal.

14. The noise shaping circuit according to claim 13, wherein the processing circuit of the dither generator is configured to at least one of high-pass filtering the random signal or the pseudo-random signal, differentiating the random signal or the pseudo-random signal and modifying a distribution of values of the random signal or the pseudo-random signal based on a dither input signal.

15. A noise shaping circuit comprising:
a forward signal path configured to generate an output signal based on an input signal;
a feedback signal path configured to feed back a feedback signal based on the output signal to the forward signal path; and
a dither generator configured to generate a dither signal and to couple the dither signal into the forward signal path to modify the input signal and into the feedback signal path,
wherein the forward signal path comprises a feedback combiner configured to modify the input signal by combing the input signal with the feedback signal, and
wherein the feedback combiner is configured to subtract the feedback signal from the input signal.

16. A digital-to-time converter comprising:
a noise shaping circuit comprising a forward signal path configured to generate an output signal based on an input signal, a feedback signal path configured to feed back a feedback signal based on the output signal to the forward signal path, and a dither generator configured to generate a dither signal and to couple the dither signal into the forward signal path to modify the input signal and into the feedback signal path, wherein the noise shaping circuit is configured to receive a control signal as the input signal; and
a digital-to-time converter circuit coupled to an output of the noise shaping circuit to receive the output signal from the noise shaping circuit as a modified control signal, wherein the digital-to-time converter circuit is configured to generate a processed oscillating signal by delaying a oscillating signal in response to the modified control signal,
wherein the feedback signal path comprises a dither signal combiner configured to combine the error signal with the dither signal to provide a dithered error signal to the noise shaping circuit.

17. The digital-to-time converter according to claim 16, wherein the noise shaping circuit comprises a signal processing circuit configured to at least one of reducing a number of different states of the output signal compared to the signal provided to the signal processing circuit and compensating a non-linearity of the digital-to-time converter circuit fully or at least partially.

18. The digital-to-time converter according to claim 16, wherein the digital-to-time converter is a digital digital-to-time converter.

* * * * *